United States Patent
Ahn et al.

(10) Patent No.: US 7,585,757 B2
(45) Date of Patent: Sep. 8, 2009

(54) SEMICONDUCTOR DEVICE AND METHOD OF MANUFACTURING THE SAME

(75) Inventors: Jong-Seon Ahn, Suwon-si (JP); Joon Kim, Seoul (KR); Jin-Hong Kim, Suwon-si (KR); Suk-Chul Bang, Yongin-si (KR); Eun-Kuk Chung, Seoul (KR); Hyung-Mo Yang, Seoul (KR); Chang-Yeon Yoo, Seoul (KR); Yun-Seung Kang, Seoul (KR); Kyung-Tae Jang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 543 days.

(21) Appl. No.: 11/446,151

(22) Filed: Jun. 5, 2006

(65) Prior Publication Data

US 2006/0281290 A1 Dec. 14, 2006

(30) Foreign Application Priority Data

Jun. 13, 2005 (KR) ...................... 10-2005-0050167

(51) Int. Cl.
*H01L 21/44* (2006.01)
*H01L 23/48* (2006.01)

(52) U.S. Cl. .................. 438/597; 438/607; 438/672; 257/E21.576; 257/E21.577; 257/E23.164

(58) Field of Classification Search .................. 438/597, 438/607, 672
See application file for complete search history.

(56) References Cited

U.S. PATENT DOCUMENTS

| | | | |
|---|---|---|---|
| 6,522,013 B1 * | 2/2003 | Chen et al. ................... | 257/774 |
| 6,689,664 B2 * | 2/2004 | Park ........................... | 438/282 |
| 7,465,637 B2 * | 12/2008 | Yamazaki .................... | 438/306 |
| 2002/0096773 A1 * | 7/2002 | Anezaki et al. ............. | 257/758 |
| 2002/0192890 A1 * | 12/2002 | Park et al. .................... | 438/197 |
| 2005/0199930 A1 * | 9/2005 | Seo et al. ..................... | 257/296 |

FOREIGN PATENT DOCUMENTS

| | | |
|---|---|---|
| JP | 2000-091433 | 3/2000 |
| JP | 2003-023111 | 1/2003 |
| KR | 1994-26113 | 7/1996 |

* cited by examiner

*Primary Examiner*—Alexander G Ghyka
(74) *Attorney, Agent, or Firm*—Volentine & Whitt, PLLC

(57) ABSTRACT

In a semiconductor device and method of manufacturing the semiconductor device, a punch-through prevention film pattern and a channel film pattern are formed on an insulation layer. The punch-through prevention pattern and the insulation layer may include nitride and oxide, respectively. The punch-through prevention pattern is located under the channel pattern.

6 Claims, 15 Drawing Sheets

SEMICONDUCTOR DEVICE AND METHOD OF MANUFACTURING THE SAME

BACKGROUND OF THE INVENTION

1. Field of the Invention

Embodiments of the invention relate generally to semiconductor devices and methods of manufacturing semiconductor devices. More particularly, embodiments of the invention relate to semiconductor devices having punch-through prevention patterns adapted to prevent punch-through defects and related methods of manufacture.

This application claims the benefit of Korean Patent Application No. 2005-50167 filed on Jun. 13, 2005, the subject matter of which is hereby incorporated by reference in its entirety.

2. Description of the Related Art

Many semiconductor devices, such as static random access memory (SRAM) devices to choose one specific example, comprise a substrate and a channel pattern formed in some portion of the substrate. The channel pattern is usually very thin.

It is common to form the channel pattern by applying a thermal treatment process to the substrate. Since many substrates are formed from silicon, the applied thermal treatment process will produce a channel pattern comprising single crystalline silicon. For example, a substrate containing an amorphous silicon layer when thermally treated will form a single crystalline silicon layer. The single crystalline silicon layer may then be patterned to form a channel pattern. Thus, channel patterns formed from single crystalline silicon layers are quite common in contemporary semiconductor devices.

In order to function with any degree of usefulness, a channel pattern typically requires some electrical connected. One common connection technique uses a contact hole to make electrical contact with the channel pattern through an overlaying insulation layer. This insulation layer may be selectively etched to form the contact hole. However, the contact hole formation process may inadvertently etch the channel pattern as well as the insulation layer, and in so doing expose a portion of the substrate proximate (e.g., below) the channel pattern. This phenomenon will be generically will be referred to "punch-through defect." Such defects cause excessive leakage current, and the electrical characteristics of the semiconductor device are generally degraded accordingly.

One approach to the prevention of punch-through defects suggests increasing the thickness of the channel pattern. However, increasing the channel pattern thickness will correspondingly increase the amount of time required to effect the associated thermal treatment process. Additionally, a thicker channel pattern may adversely affect the conversion of an amorphous silicon into single crystalline silicon.

SUMMARY OF THE INVENTION

Embodiments of the invention provide semiconductor devices having less susceptibility to the formation of punch-though defects, as well as related methods of fabrication.

Thus, in one embodiment the invention provides a semiconductor device comprising; a substrate comprising a first conductive region, a first insulation layer formed on the substrate, a punch-through prevention film pattern formed on the first insulation layer over the first conductive region, an epitaxial plug making electrical contact with the first conductive region through the punch-through prevention film pattern and the first insulation layer, a channel film pattern formed on the punch-through prevention film pattern and the epitaxial plug, a second insulation layer formed on the first insulation layer to cover the channel film pattern and the punch-through prevention film pattern, and a contact making electrical contact with the channel film pattern through the second insulation layer.

In a related aspect, the substrate may further comprise a second conductive region; and the semiconductor device may further comprise a second contact making electrical contact with the second conductive region through the first and second insulation layers.

In another embodiment, the invention provides a method of manufacturing a semiconductor device, the method comprising; forming a first insulation layer on a substrate, the substrate comprising a conductive region, forming a punch-through prevention film on the first insulation layer, forming an opening through the first insulation layer and the punch-through prevention film to expose the first conductive region, forming an epitaxial plug in the opening on the first conductive region, forming a channel film on the punch-through prevention film and the epitaxial plug, forming a punch-through prevention film pattern and the channel film pattern by patterning the punch-through prevention film and the channel film, forming a second insulation layer on the first insulation layer to cover the punch-through prevention film pattern and the channel film pattern, and forming a first contact making electrical contact with the channel film pattern through the second insulation layer.

In a related aspect, the substrate may further comprise a second conductive region, and the method may further comprise forming a second contact making electrical contact with the second conductive region through the first and second insulation layers.

BRIEF DESCRIPTION OF THE DRAWINGS

Several exemplary embodiments are described hereafter with reference to the accompanying drawings. In the drawings, the size and/or relative sizes of layers and regions may be exaggerated for clarity. The drawings are not to scale. Like reference numerals in the drawings and associated portions of the written description refer to like, or similar, elements.

DESCRIPTION OF EXEMPLARY EMBODIMENTS

Figure 1:
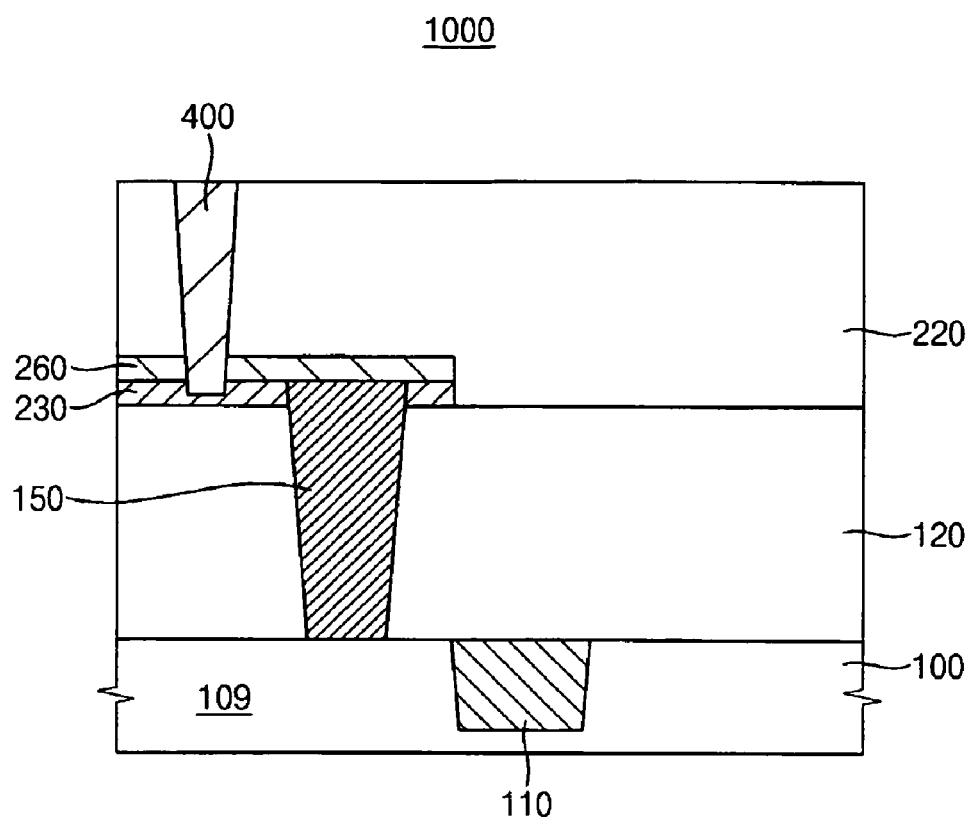
FIG. 1 is a cross-sectional view illustrating a channel structure in accordance with one embodiment of the invention.

Several embodiments of the invention will now be described with reference to the accompanying drawings. However, the invention may be embodied in many different forms and should not be construed as limited to only the embodiments set forth herein. Rather, the embodiments are provided as teaching examples.

It will be understood that when an element or layer is referred to as being "on" and/or "connected to" another element or layer, the element or layer may be directly on and/or connected to the other element or layer or intervening elements or layers may be present. In contrast, when an element is referred to as being "directly on," and/or "directly connected to" another element or layer, there may be no intervening elements or layers present. As used herein, the term "and/or" may include any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms may be used to distinguish one element, component, region, layer and/or section from another element, component, region, layer and/or section. For example, a first element, component, region, layer and/or section discussed below could be termed a second element, component, region, layer and/or section without departing from the teachings of the invention.

Spatially relative terms, such as "beneath," "below," "lower," "above," "upper" and the like may be used to describe an element and/or feature's relationship to another element(s) and/or feature(s) as illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (rotated 90 degrees or at other orientations) and the spatially relative descriptors used herein interpreted accordingly.

Embodiments of the invention are described with reference to cross-section illustrations that are idealized schematic illustrations. As such, variations from the shapes of the illustrations as a result, for example, of manufacturing techniques and/or tolerances, are to be expected. Thus, embodiments of the invention should not be construed as being limited only regions having the illustrated shapes, but include deviations in shapes that result, for example, from manufacturing processes. For example, an etched region illustrated as a rectangle will in actual implementation have rounded corners or other curved features. Thus, the regions illustrated in the figures are schematic in nature not intended to limit the scope of the invention by their specific illustrated shape.

FIG. 1 is a cross-sectional view illustrating a channel structure in accordance with an embodiment of the invention. Referring to FIG. 1, the channel structure 1000 generally comprises a substrate 100, a first insulation layer 120, a punch-through prevention film pattern 230, an epitaxial plug 150, a channel film pattern 260, a second insulation layer 220 and a contact 400.

Substrate 100 may be formed from single crystalline silicon. In the illustrated embodiment, an isolation layer 110 is formed in substrate 100 to divide substrate 100 into a field region and an active region, wherein the active region encloses the field region. A lower structure (not shown) such as a transistor, a pad, a contact plug, a conductive pattern or an insulation pattern may be formed within the active region. In the illustrated embodiment, substrate 100 comprises a conductive region 109 within the active region. Conducive region 109 is generally indicated within substrate 100 but may have a variety of specific forms (e.g., doped well regions, etc.).

First insulation layer 120 is formed on substrate 100 to cover the lower structure. First insulation layer 120 may be formed from an oxide, such as a silicon oxide, including as examples; undoped silicate glass (USG), boro-phosphor silicate glass (BPSG), phosphor silicate glass (PSG), spin on glass (SOG), tetraethylorthosilicate (TEOS), plasma enhanced-TEOS (PE-TEOS) and/or high density plasma-chemical vapor deposition (HDP-CVD) oxide.

In one range of embodiments, a first insulation layer 120 having a thickness of less than 1500 Å may allow the formation of a leakage current. In another range of embodiments, a first insulation layer 120 having a thickness greater than about 3000 Å may cause difficulties in the formation of epitaxial plug 150. As a result, many embodiments of the invention will incorporate a first insulation layer 120 having a thickness ranging between about 1500 Å to 3000 Å, and more particularly between about 2000 Å to 2500 Å.

In the illustrated embodiment, punch-through prevention film pattern 230 is formed on a portion of first insulation layer 120 overlaying conductive region 109. Punch-through prevention film pattern 230 may be formed from a material having an etch selectivity with respect to first insulation layer 120. In one embodiment, punch-through prevention film pattern 230 has a single-patterned structure. That is, punch-through prevention film pattern 230 is formed by patterning a single-layered structure.

For example, if first insulation layer 120 is assumed to be formed from an oxide, such as silicon oxide, then punch-through prevention film pattern 130 may be formed from a nitride, such as silicon nitride. Alternatively, in other embodiments, punch-through prevention film pattern 230 may be formed from an oxynitride (e.g., silicon oxynitride), a metal oxide (e.g., hafnium oxide), and/or a carbide (e.g., silicon carbide).

In certain embodiments, it is desirable to form punch-through prevention film pattern 230 with a thickness of at least 100 Å. Thinner punch-through prevention film patterns may be difficult to form efficiently without a serious risk of defect, or without hazarding the connection of contact 400 to substrate 100 through punch-through prevention film pattern 230 and first insulation layer 120. On the other hand, certain embodiments wherein punch-through prevention film pattern 230 is formed to a thickness greater than about 400 Å, the effective formation of epitaxial plug 150 is made difficult. As a result, many embodiments of the invention will be formed with a punch-through prevention film pattern 230 having a thickness ranging from about 100 Å to 400 Å, and more particularly from about 200 Å to 350 Å.

Assuming a first insulation layer 120 having a thickness ranging from about 1500 Å to 3000 Å, and punch-through prevention film pattern 230 having a thickness ranging from about 100 Å to 400 Å, a ratio punch-through prevention film pattern 230 thickness to first insulation layer 120 thickness will range from about 1:3.75 to 1.0:30.

Epitaxial plug 150 may be used to provide electrical contact to conductive region 109 through punch-through prevention film pattern 230 and first insulation layer 120. That is, in one embodiment, epitaxial plug 150 electrically connected to conductive region 109 may be enclosed by punch-through prevention film pattern 230 and first insulation layer 120. Epitaxial plug 150 may be formed using a selective epitaxial growth (SEG) process that uses first conductive region 109 as a seed layer. Thus, in one embodiment, both epitaxial plug 150 and conductive region 109 are formed from single crystalline silicon.

Channel film pattern 260 is formed on punch-through prevention film pattern 230 and epitaxial plug 150. In one embodiment, channel film pattern 260 is formed from single crystalline silicon. Where this is the case, channel film pattern 260 may be formed using a thermal treatment process that uses epitaxial plug 150 as a seed layer. Thus, no physical interface exists between channel film pattern 260 and epitaxial plug 150. That is, for example, channel film pattern 260 and epitaxial plug 150 are formed as one body.

Embodiments wherein channel film pattern 260 is formed with a thickness less than about 200 Å are typically disadvantageous in that a channel may not be efficiently formed in channel film pattern 260. On the other hand, embodiments wherein channel film pattern 260 is formed with a thickness greater than about 300 Å require too long to be properly treated with an associated thermal treatment process. Thus, many embodiments of the invention will be formed with a channel film pattern 260 having a thickness ranging between about 200 Å to 300 Å, and more particularly, between about 220 Å to 270 Å.

Assuming that channel film pattern 260 has a thickness ranging from about 200 Å to 300 Å and a punch-through prevention film pattern 230 has a thickness ranging from about 300 Å to 400 Å, a ratio of the thickness of punch-through prevention film pattern 260 to the thickness of channel film pattern 260 will range from about 1.0:0.5 to 1.0:3.0. Further, assuming this range of thickness for channel film pattern 260 and further assuming that insulation layer 120 has a thickness ranging from about 1500 Å to 3000 Å, a ratio of the thickness of channel film pattern 260 to the thickness of first insulation layer 120 will range from about 1:5 to 1:15.

Second insulation layer 220 is formed on the first insulation layer 120 to cover punch-through prevention film pattern 230 and channel film pattern 260. Second insulation layer 220 may be formed from an oxide, such as a silicon oxide like BPSG, PSG, USG, SOG, TEOS, PE-TEOS and/or HDP-CVD oxide. In some embodiments, second insulation layer 220 will be formed from the same material as first insulation layer 120. In other embodiments, second insulation layer 220 will be formed from a material substantially different from that used to form first insulation layer 120.

Contact 400 is formed from a conductive material to provide electrical contact with channel film pattern 260 through second insulation layer 220. Doped polysilicon may be used as the conductive material. Alternatively, a metal, such as tungsten (W), aluminum (Al), copper (Cu) and/or titanium (Ti) may be used. Alternatively, a metal nitride, such as titanium aluminum nitride (TiAlN), titanium nitride (TiN), tungsten nitride (WN) and/or aluminum nitride (AlN) may be used.

Because punch-through prevention film pattern 230 is formed under channel film pattern 260, the risk of contact 400 being improperly connected to substrate 100 through first insulation layer 120 is greatly reduced. Thus, the possibility of forming a punch-through defect may be efficiently prevented by the additional use of punch-through prevention film pattern 230.

FIGS. 2 to 11 are cross-sectional views illustrating a method of manufacturing adapted to the formation of the exemplary channel structure shown in FIG. 1.

Figure 2:
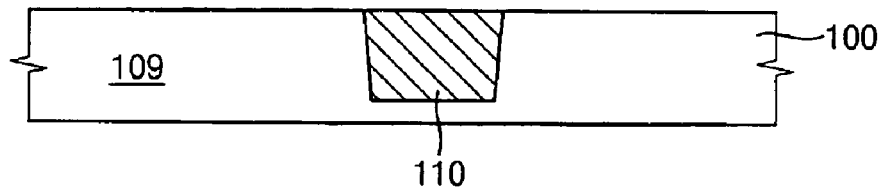
FIGS. 2 to 11 are cross-sectional views illustrating methods of manufacturing the exemplary channel structure shown in FIG. 1.

Referring to FIG. 2, isolation layer 110 is formed in substrate 100 to divide substrate 100 into an active region and a field region, wherein the active region encloses the field region. In one embodiment, substrate 100 further comprises conductive region 109 within the active region. Substrate 100 may be formed from a single crystalline silicon substrate or a silicon-on-insulator (SOI) substrate.

Isolation layer 110 may be formed in substrate 100 using an isolation process, such as a shallow trench isolation (STI) process, a thermal oxidation process, or a local oxidation of silicon (LOCOS) process. Isolation layer 110 may be formed from an oxide, such as silicon oxide.

A lower structure (not shown) may be formed within the active region. This lower structure may comprise a transistor, a contact region, a pad, a conductive pattern, and/or an insulation pattern.

Figure 3:
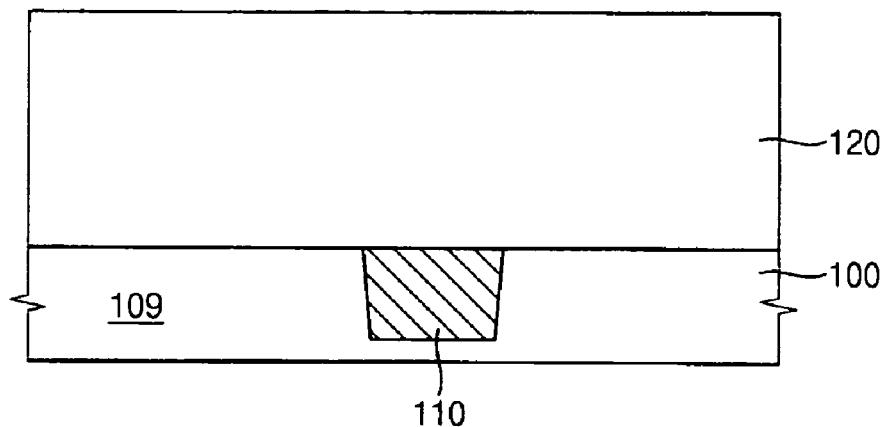

Referring to FIG. 3, first insulation layer 120 is formed on substrate 100. First insulation layer 120 may be formed using a chemical vapor deposition (CVD) process, a plasma enhanced chemical vapor deposition (PE-CVD) process, an atomic layer deposition (ALD) process, and/or a high density plasma chemical vapor deposition (HDP-CVD) process. First insulation layer 120 may be formed from an oxide, such as BPSG, PSG, USG, SOG, TEOS, PE-TEOS and/or HDP-CVD oxide.

Figure 4:
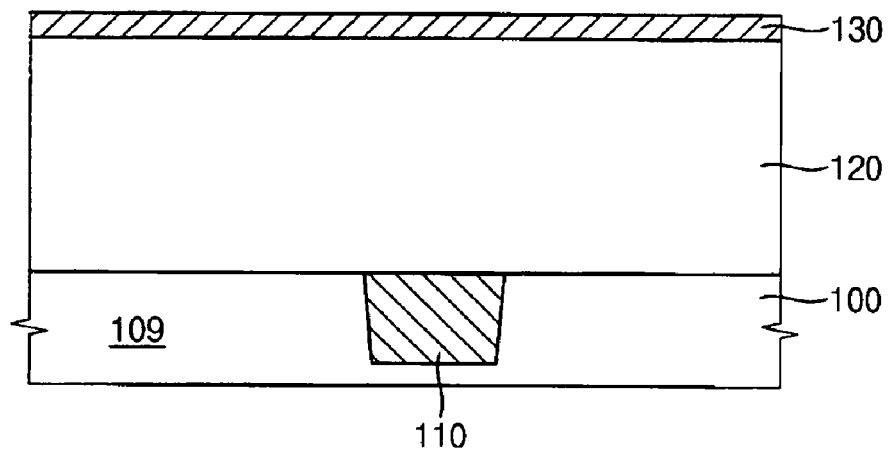

Referring to FIG. 4, a punch-through prevention layer 130 is formed on first insulation layer 120 using, for example, a sputtering process, a CVD process, an ALD process, and/or a pulse laser deposition (PLD) process. In certain embodiments of the invention, punch-through prevention film 130 will be formed from a material comprising nitrogen. In such cases, punch-through prevention film 130 may be formed with an etch selectively with respect to an oxide material used to form first insulation layer 120. Thus, punch-through prevention film 130 may be used as a mask for an etching process adapted to form an opening 140 (see FIG. 5) through first insulation layer 120.

In one example, punch-through prevention layer 130 is formed from a nitride, such as silicon nitride. As another example, punch-through prevention film 130 is formed from an oxynitride, such as silicon oxynitride. As yet another example, punch-through prevention film 130 is formed from a metal oxide, such as a hafnium oxide. As still another example, punch-through prevention film 130 is formed from a carbide, such as silicon carbide.

Figure 5:
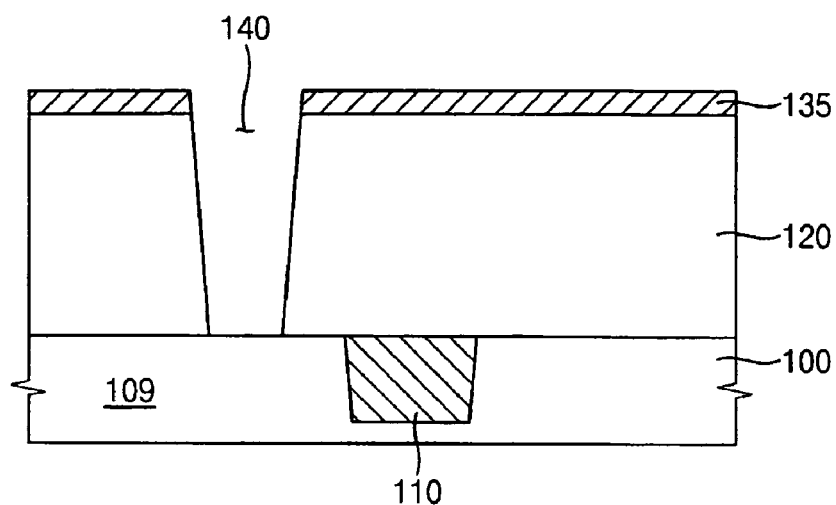

Referring to FIG. 5, a photoresist pattern (not shown) is formed on punch-through prevention film 130. An etching process that uses the photoresist pattern as a mask is then performed on punch-through prevention film 130 to form a preliminary punch-through prevention film pattern 135.

Thereafter, the photoresist pattern is removed using an ashing process and/or a stripping process. First insulation layer 120 is then etched using preliminary punch-through prevention film pattern 135 as a mask in order to form opening 140 partially exposes conductive region 109 of substrate 100.

Figure 6:
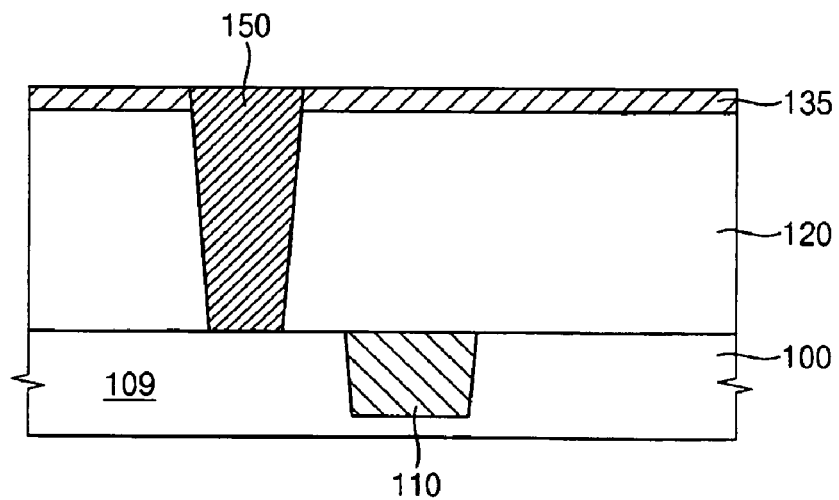

Referring to FIG. 6, epitaxial plug 150 is then formed in opening 140. Epitaxial plug 150 may be formed using a SEG process that uses conductive region 109 as a seed layer. Where conductive layer 109 is formed from single crystalline silicon and a SEG process is used to form epitaxial plug 150, epitaxial plug 150 will also be formed from single crystalline silicon. For example, epitaxial plug 150 may be formed by a SEG process using a silicon source gas, such as silicon tetrachloride (SiCl4), silane (SiH4), dichloro silane (SiH2Cl2) and/or trichloro silane (SiHCl3).

Epitaxial plug 150 may not properly form at temperatures below 750° C. On the other hand, at temperatures above 1250° C., the SEG process may not be efficiently controlled. Thus, many embodiments of the invention will form epitaxial plug 150 at a temperature ranging from about 750° C. to 1,250° C., and more particularly between about 800° C. to 900° C.

In some embodiments, it will be advantageous to planarize an epitaxial layer formed by the SEG process. A chemical mechanical polishing (CMP) process and/or an etch-back process may be used for this purpose.

Figure 7:
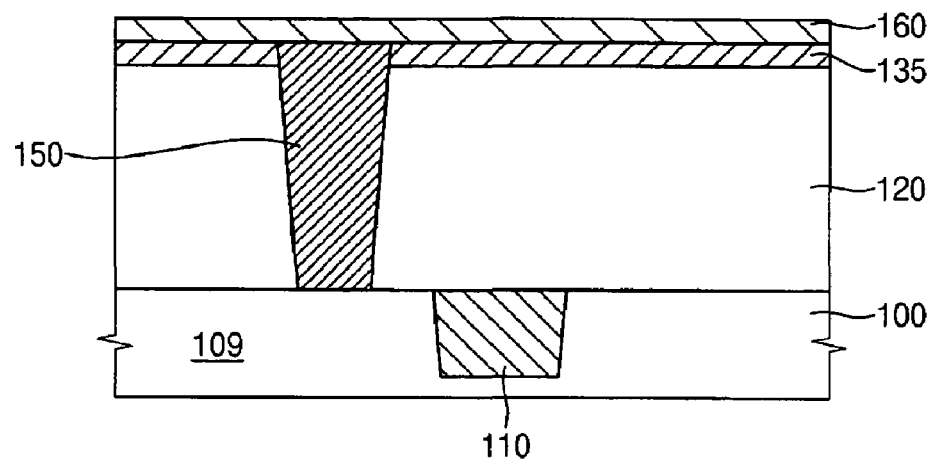

Referring to FIG. 7, a preliminary channel film (not shown) is formed on preliminary punch-through prevention film pattern 135 and epitaxial plug 150 using a deposition process, such as a CVD process. The preliminary channel film may be formed from a material comprising amorphous silicon.

A thermal treatment process may then be performed on the preliminary channel film to form a channel film 160. Channel film 160 may be formed from single crystalline silicon. In some processes adapted to the formation of channel film 160, epitaxial plug 150 may be used as a seed layer. Thus, no physical interface exists between channel film 160 and epitaxial plug 150. That is, for example, channel film 160 and epitaxial plug 150 are formed as one body.

A thermal treatment process applied to the preliminary channel film at temperatures below about 570° C., may disadvantageously fail to change the amorphous silicon into single crystalline silicon. However, a thermal treatment process applied to the preliminary channel film at a temperature above about 650° C., may not be well controlled. Thus, many embodiments of the invention will incorporate a thermal treatment process conducted at a temperature ranging from between about 570° C. to 650° C., and more particularly between about 600° C. to 620° C.

Figure 8:
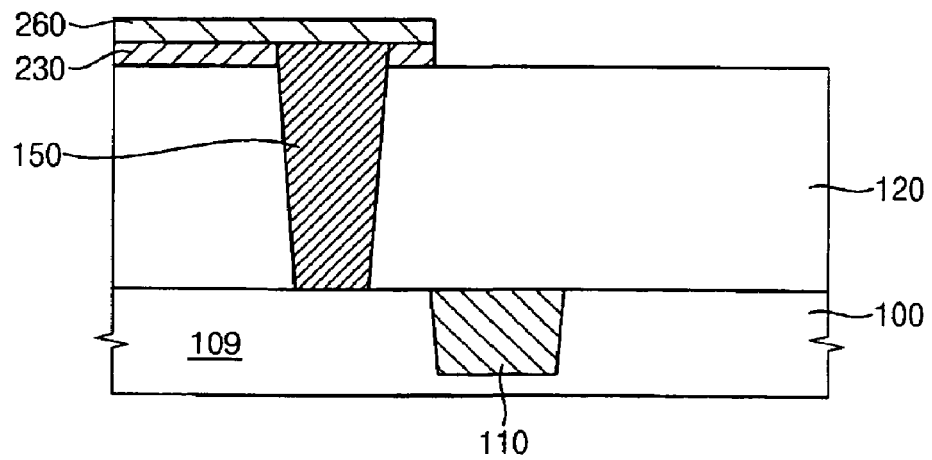

Referring to FIG. 8, a photolithography process is performed on preliminary punch-through prevention film pattern 135 and channel film 160 to form punch-through prevention film pattern 230 and channel film pattern 260, as described above, for example. In one embodiment, punch-through prevention film pattern 230 and channel film pattern 260 will completely cover epitaxial plug 150.

Figure 9:
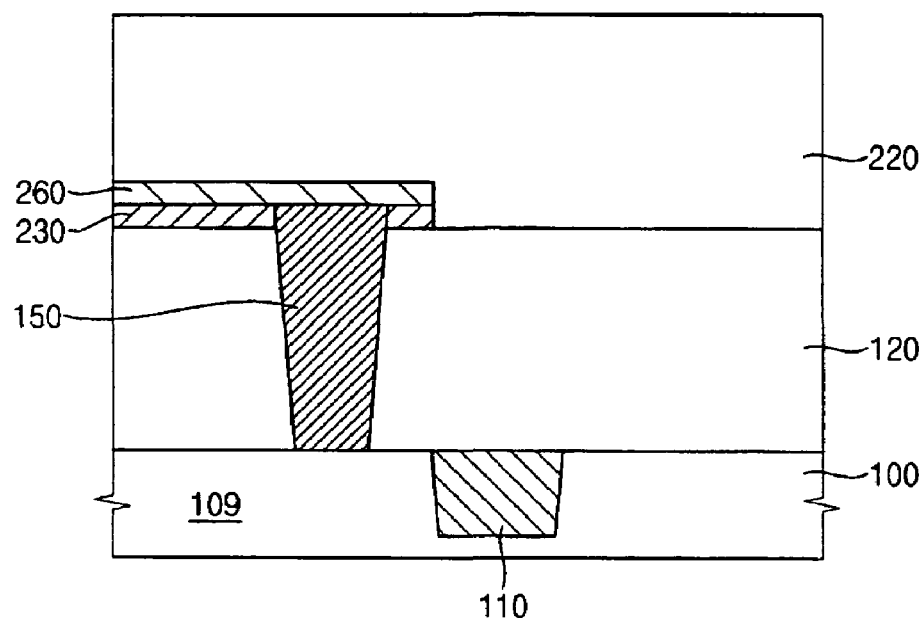

Referring to FIG. 9, second insulation layer 220 is formed on first insulation layer 120 to cover punch-through prevention film pattern 230 and channel film pattern 260. Second insulation layer may be formed from a material comprising an oxide, such as a silicon oxide including, as examples, BPSG, PSG, PSG, USG, SOG, PE-TEOS and/or HDP-CVD oxide.

Figure 10:
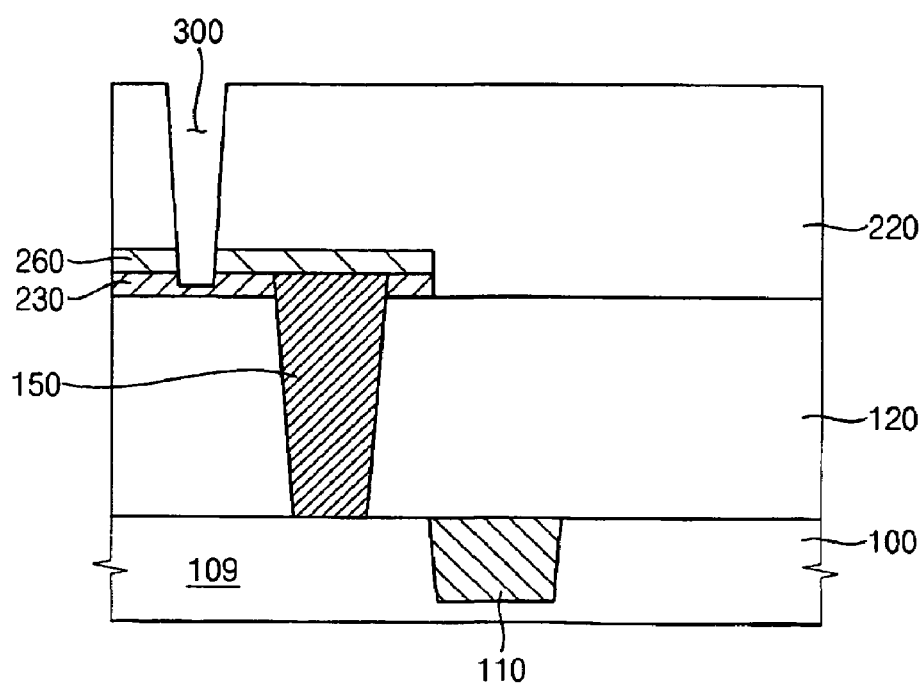

Referring to FIG. 10, a contact hole 300 exposing a portion of channel film pattern 260 is formed using, for example, a conventional photolithography process. Punch-through prevention film pattern 230 formed under channel film pattern 260 is adapted to prevent contact hole 300 from extending all the way to substrate 100. Thus, contact hole 300 will not expose any portion of substrate 100.

Figure 11:
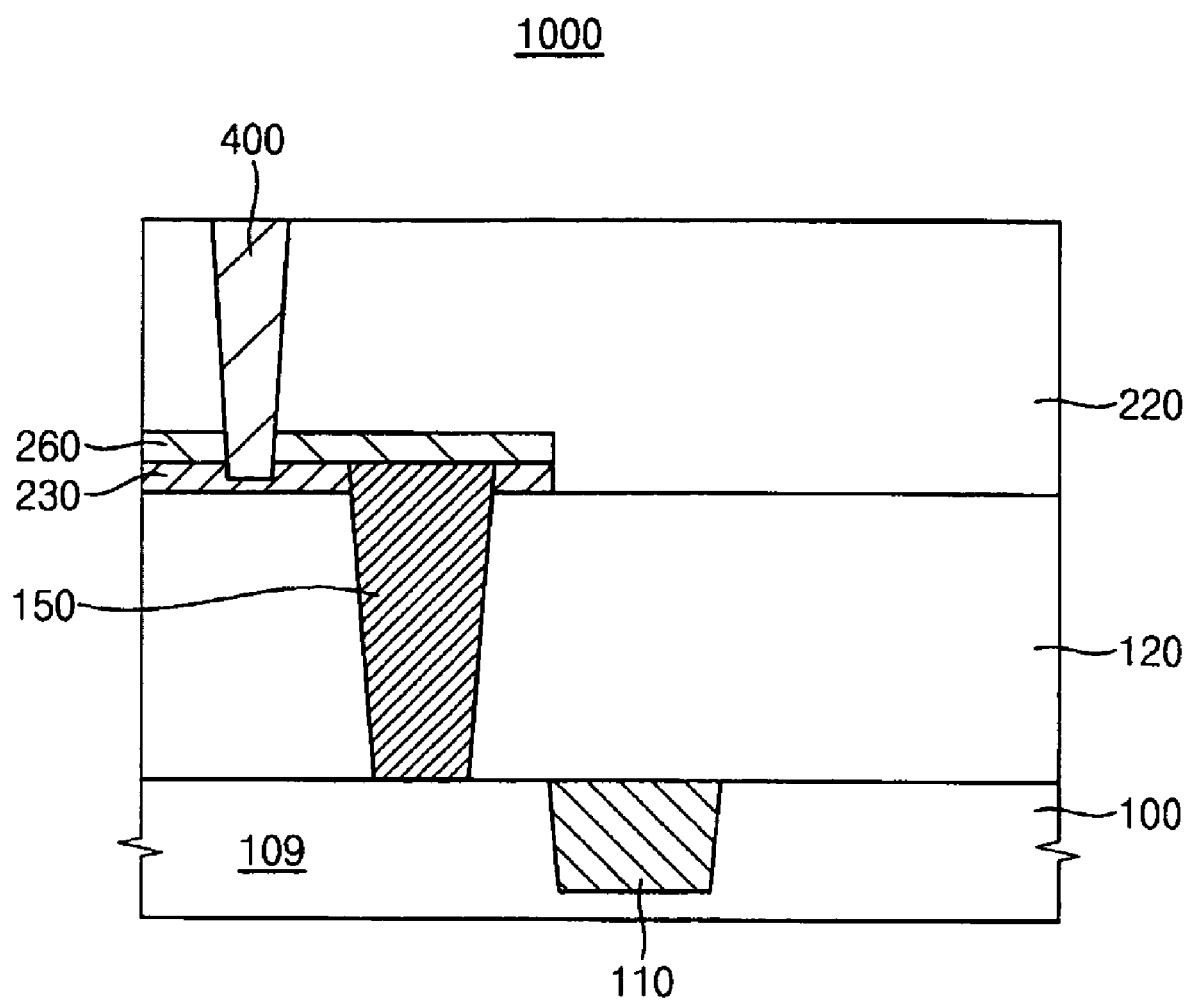

Referring to FIG. 11, a conductive layer (not shown) is formed on second insulation layer 220 to fill contact hole 300. The conductive layer may be formed from a conductive material, such as doped polysilicon, a metal, such as aluminum, copper, titanium and/or tungsten, or a metal nitride, such as aluminum nitride, titanium nitride and/or tungsten nitride.

A planarization process (e.g., a CMP process and/or an etch-back process) is then performed on the conductive layer until second insulation layer 220 is exposed. Thus, the contact 400 may be formed in contact hole 300.

Figure 12:
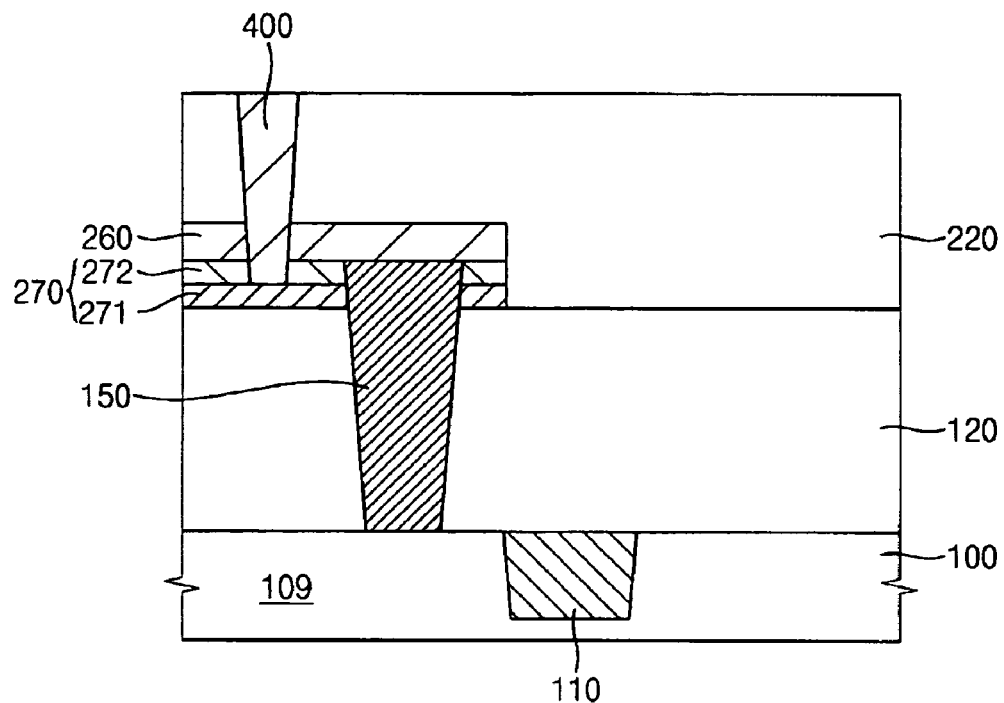
FIG. 12 is a cross-sectional view illustrating a channel structure in accordance with another embodiment of the invention.

FIG. 12 is a cross-sectional view illustrating a channel structure in accordance with another embodiment of the invention. The channel structure 2000 is substantially similar to channel structure 1000 already described in the context of in FIG. 1 and further in context of the exemplary method of FIGS. 2 through 11. However, channel structure 2000 further comprises a compound punch-through prevention film pattern 270.

Referring to FIG. 12, compound punch-through prevention film pattern 270 is formed on first insulation layer 120 from first and second punch-through prevention film patterns 271 and 272. In one embodiment, punch-through prevention film pattern 270 may be formed from a double-patterned structure. As before, punch-through prevention film pattern 270 may be formed from a material having an etch selectivity with respect to first insulation layer 120. Within compound punch-through prevention film pattern 270, first punch-through prevention film pattern 271 is formed on first insulation layer 120, and second punch-through prevention film 272 is formed on first punch-through prevention film pattern 271. In one embodiment, first punch-through prevention film pattern 271 is formed from silicon oxynitride, and second punch-through prevention film pattern 272 is formed from silicon nitride.

The increased thickness and compound nature of compound punch-through prevention film pattern 270, as formed under channel film pattern 260 and contact 400 further protects substrate 100 from being improperly connected to contact 400 through first insulation layer 120. Thus, punch-through defects are prevented.

FIGS. 13 to 16 are cross-sectional views illustrating a method of manufacturing the exemplary channel structure shown in FIG. 12.

This method of manufacturing the channel structure 2000 is substantially similar to that illustrated and described with respect to FIGS. 2 through 11 with the exception of those steps adapted to form compound punch-through prevention film pattern 270.

Figure 13:
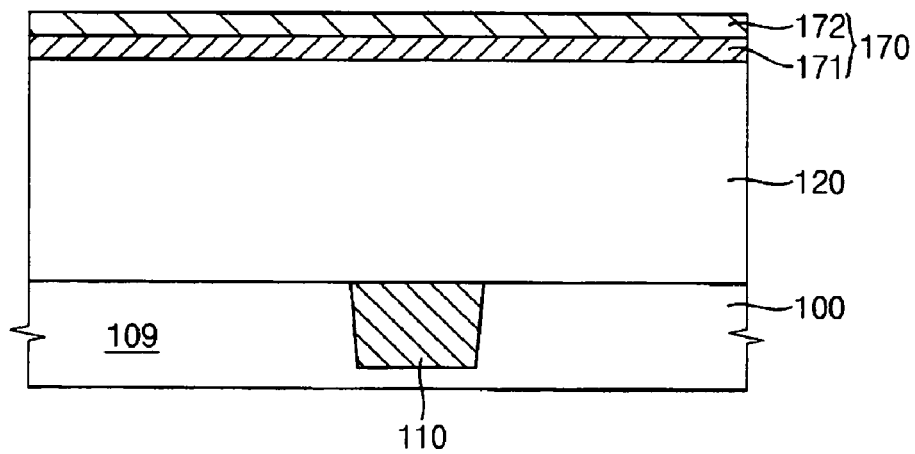
FIGS. 13 to 16 are cross-sectional views illustrating methods of manufacturing the exemplary channel structure shown in FIG. 12.

Referring to FIG. 13, a first punch-through prevention film 171 and a second punch-through prevention film 172 are subsequently formed on first insulation layer 120 formed on substrate 100 having an isolation layer 110. Thus, a compound punch-through prevention film 170 including first punch-through prevention film 171 and second punch-through prevention film 172 is formed on first insulation layer 120. First and second punch-through prevention films 171 and 172 may have an etch selectivity with respect to first insulation layer 120. For example, first insulation layer 120 may be formed from an oxide, and first and second punch-through prevention films 171 and 172 may be formed from silicon oxynitride and silicon nitride, respectively.

Figure 14:
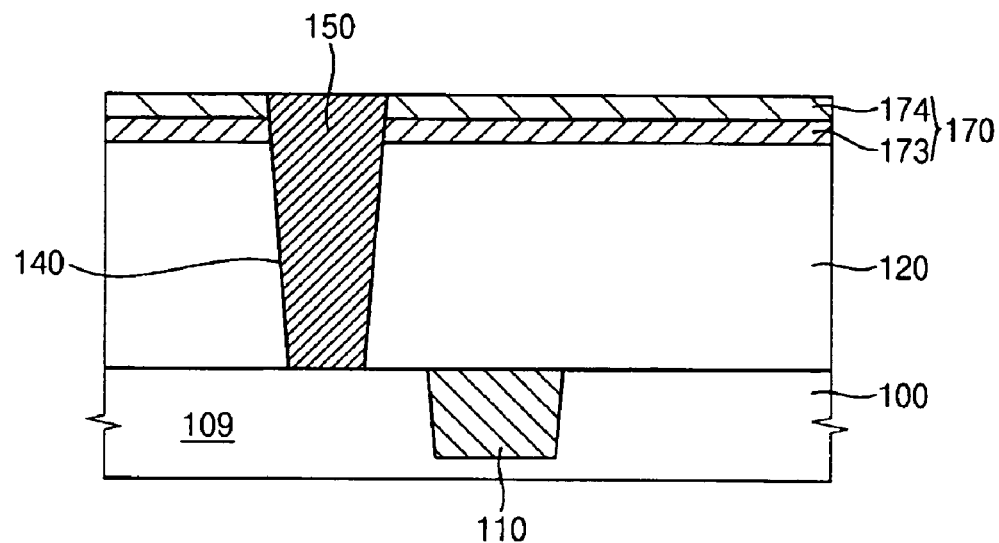

Referring to FIG. 14, a photolithography process is performed on compound punch-through prevention film 170 including first and second punch-through prevention films 171 and 172 to form opening 140 through first insulation layer 120. Epitaxial plug 150 is then formed in opening 140.

Figure 15:
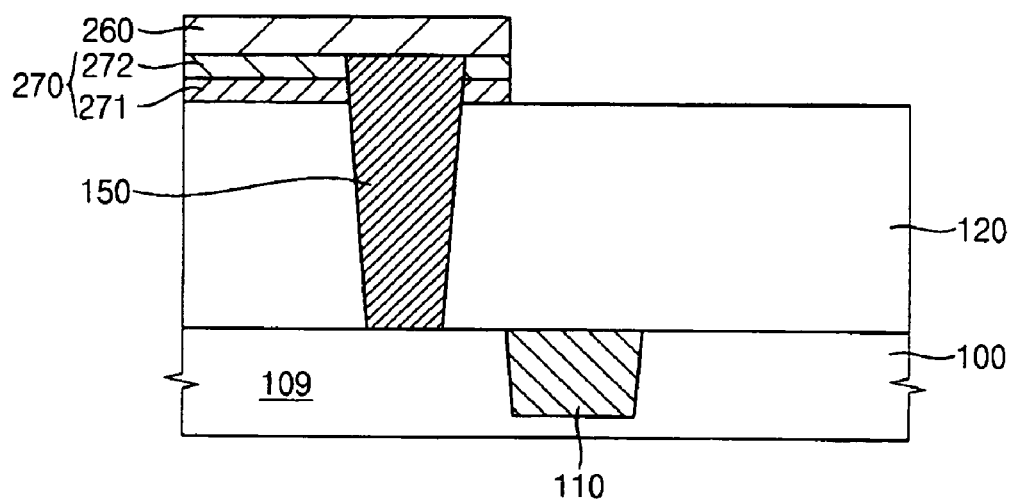

Referring to FIG. 15, a channel film (not shown) is formed on compound punch-through prevention film 170. Then, the channel film and compound punch-through prevention film 170 are patterned to form punch-through prevention film pattern 270 and channel film pattern 260.

Figure 16:
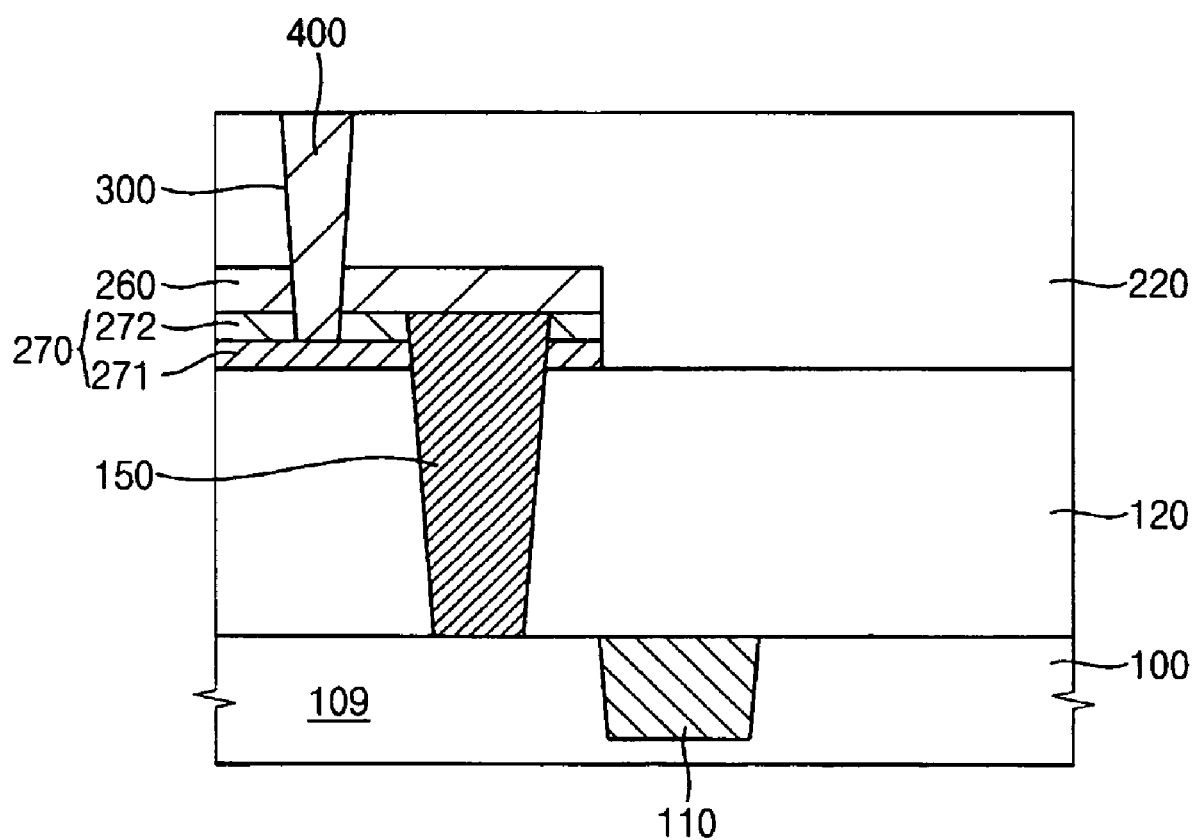

Referring to FIG. 16, second insulation layer 220 is formed on compound punch-through prevention film pattern 270 and channel film pattern 260. A photolithography process and an etch process are then performed on second insulation layer 220 to form contact opening 300. In one embodiment, contact opening 300 penetrates the second punch-through prevention pattern 272, but not first punch-through prevention film pattern 271 due to their different material natures relative to the applied etch process. Contact 400 is then formed in contact opening 300.

Figure 17:
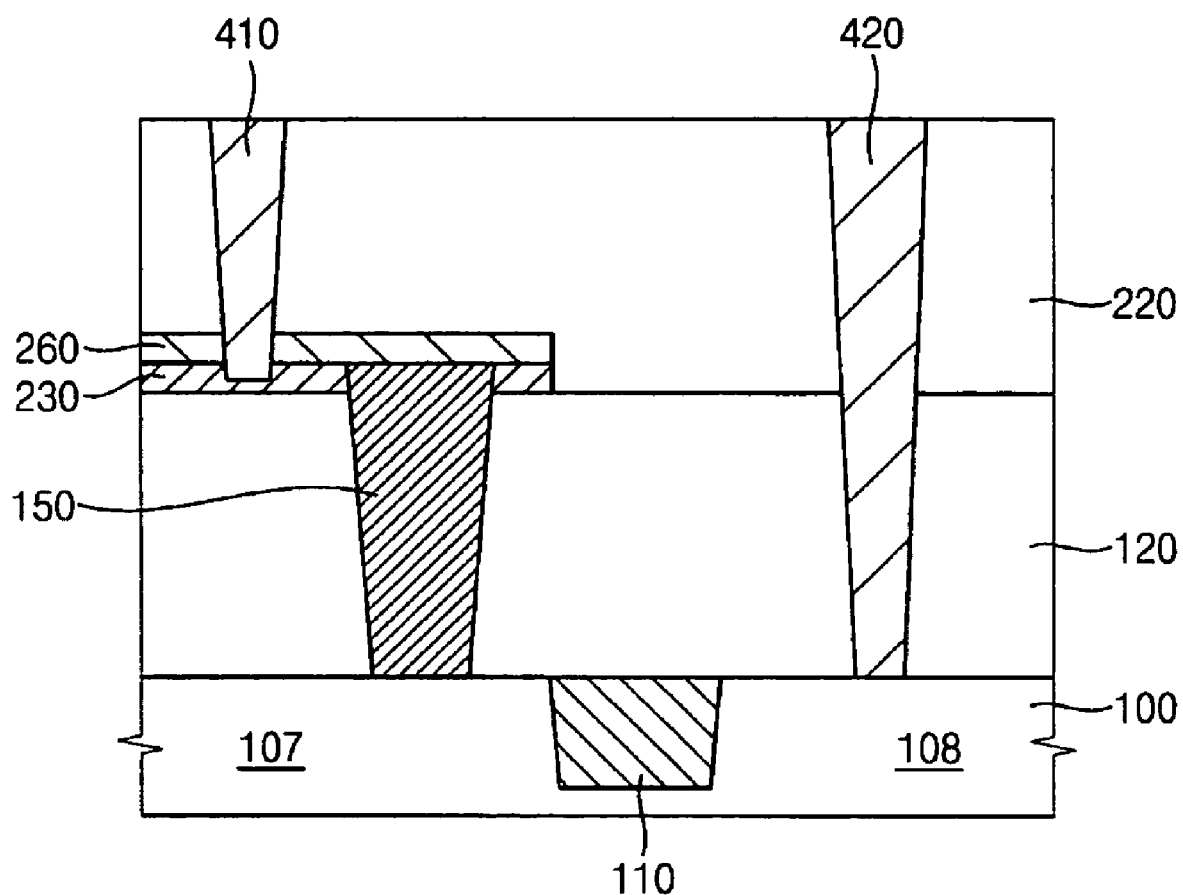
FIG. 17 is a cross-sectional view illustrating a channel structure in accordance with another embodiment of the invention.

FIG. 17 is a cross-sectional view illustrating a channel structure in accordance with another embodiment of the invention.

The channel structure 3000 shown in FIG. 17 is substantially similar to channel structure 1000 already illustrated and described with reference to FIG. 1, except it comprises a first contact 410 and a second contact 420.

Referring to FIG. 17, channel structure 3000 generally comprises substrate 100, first insulation layer 120, punch-through prevention film pattern 230, epitaxial plug 150, channel film pattern 260, second insulation layer 220, first contact 410 and second contact 420.

However, in the illustrated embodiment substrate 100 comprises first conductive region 107 and a second conductive region 108. Like first conductive region 107, second conductive region 108 is generally indicated but may take a variety of specific forms. As before, epitaxial plug 150 makes electrical contact to first conductive region 107 through first insulating layer 120.

Also, as before, first contact 410 makes electrical contact with channel film pattern 260 through second insulation layer 220. However, because punch-through prevention layer 230 is formed under channel film pattern 260, first contact 410 does not make improper contact with substrate 100, or more particularly with first conductive region 107 formed in substrate 100.

In contrast, second contact 420 is formed to provide electrical contact with second conductive region 108 of substrate 100 through second insulation layer 220 and first insulation layer 120.

Thus, although first and second contacts, 410 and 420, may be simultaneously formed by an etching process, only second contact 420 makes electrical contact with a predetermined portion of substrate 100 (e.g., second conductive region 108).

Figure 18:
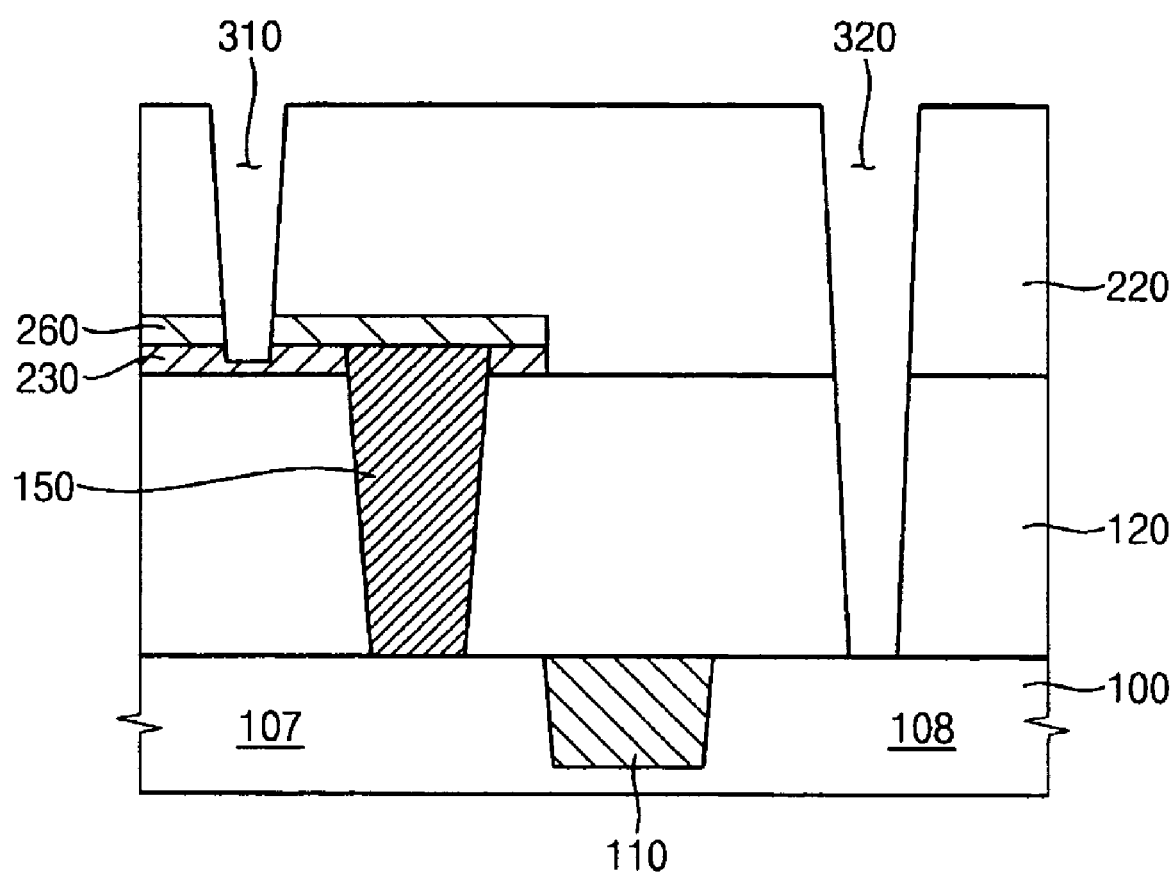
FIGS. 18 and 19 are cross-sectional views illustrating methods of manufacturing the exemplary channel structure shown in FIG. 17.
Figure 19:
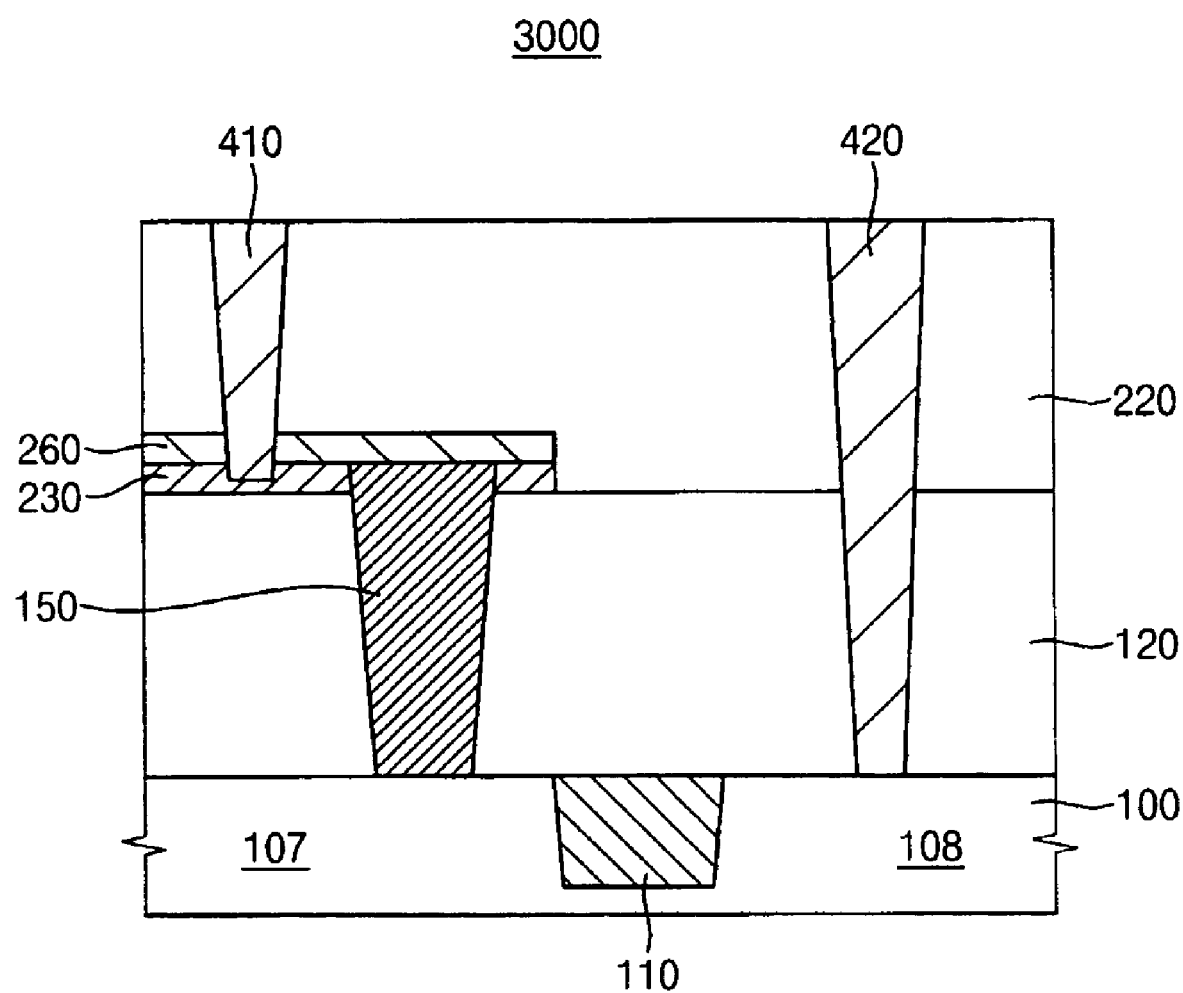

FIGS. 18 and 19 are cross-sectional views illustrating a method of manufacturing the exemplary channel structure 3000 shown in FIG. 17.

The method of manufacturing channel structure 3000 is substantially similar to that already illustrated and described with reference to FIGS. 2 through 11, except for the steps adapted to form both first and second contacts, 410 and 420.

Referring to FIG. 18, a photolithography process is performed on second insulation layer 220 and first insulation layer 120 to form a first hole 310 and a second hole 320. Here, second hole 320 exposes second conductive region 108 of substrate 100. However, first hole 310 may not expose any portion of substrate 100.

That is, punch-through prevention film pattern 230 is formed from a material having an etch selectivity with respect to first and second insulation layers 120 and 220 formed under a channel film pattern 160. Thus, although first and second holes, 310 and 320, are simultaneously formed by a common etching process, first hole 310 does not expose substrate 100.

Referring to FIG. 19, first and second contacts 410 and 420 are formed in first and second holes 310 and 320, respectively. First contact 410 makes electrical contact with channel film pattern 260, and second contact 420 makes electrical contact with second conductive region 108 of substrate 100.

Figure 20:
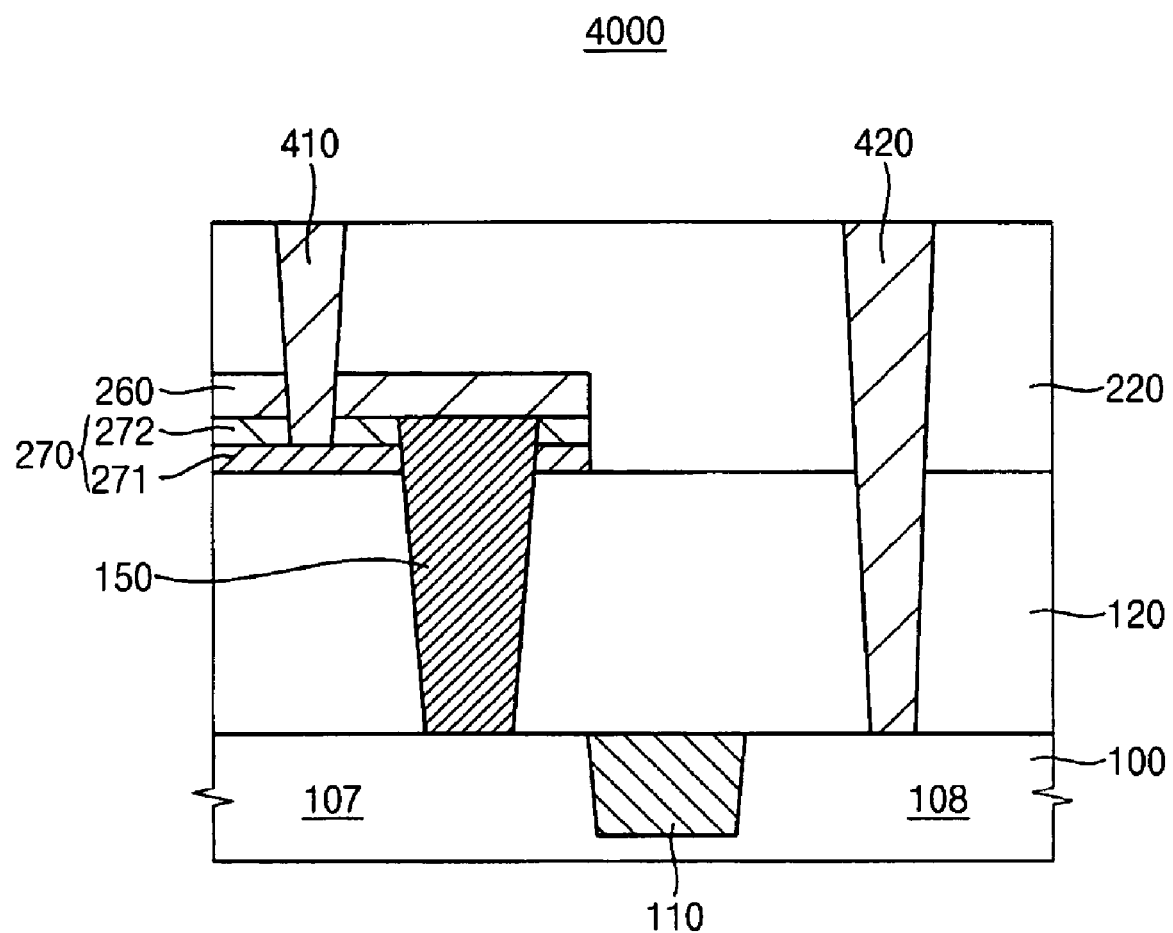
FIG. 20 is a cross-sectional view illustrating a channel structure in accordance with another embodiment of the invention.

FIG. 20 is a cross-sectional view illustrating a channel structure 4000 in accordance with another embodiment of the invention.

Channel structure 4000 is substantially similar to channel structure 2000 already illustrated and described with reference to FIG. 12, except for a first contact 410 and a second contact 420.

Referring to FIG. 20, channel structure 4000 generally comprises substrate 100, first insulation layer 120, punch-through prevention film pattern 270, epitaxial plug 150, channel film pattern 260, second insulation layer 220, first contact 410 and second contact 420.

Substrate 100 may comprise first conductive region 107 and second conductive region 108. Epitaxial plug 150 is formed to make electrical contact with first conductive region 107.

Compound punch-through prevention film pattern 270 is formed as described above from first punch-through prevention film pattern 271 formed (e.g.,) from silicon oxynitride) and second punch-through prevention film pattern 273 formed (e.g.,) from silicon nitride.

First contact 410 again makes electrical contact with channel film pattern 260 through second insulation layer 220. Second contact 420 makes electrical contact with second conductive region 108 through second insulation layer 220 and first insulation layer 120.

As before, although first and second contacts, 410 and 420, may be simultaneously formed by a common etching process, only second contact 420 makes electrical contact with any portion of substrate 100, and because punch-through prevention pattern 230 is formed under channel film pattern 260, first contact 410 will not be improper connected to substrate 100 through first insulation layer 120, thereby preventing the formation of a punch-through defect.

Figure 21:
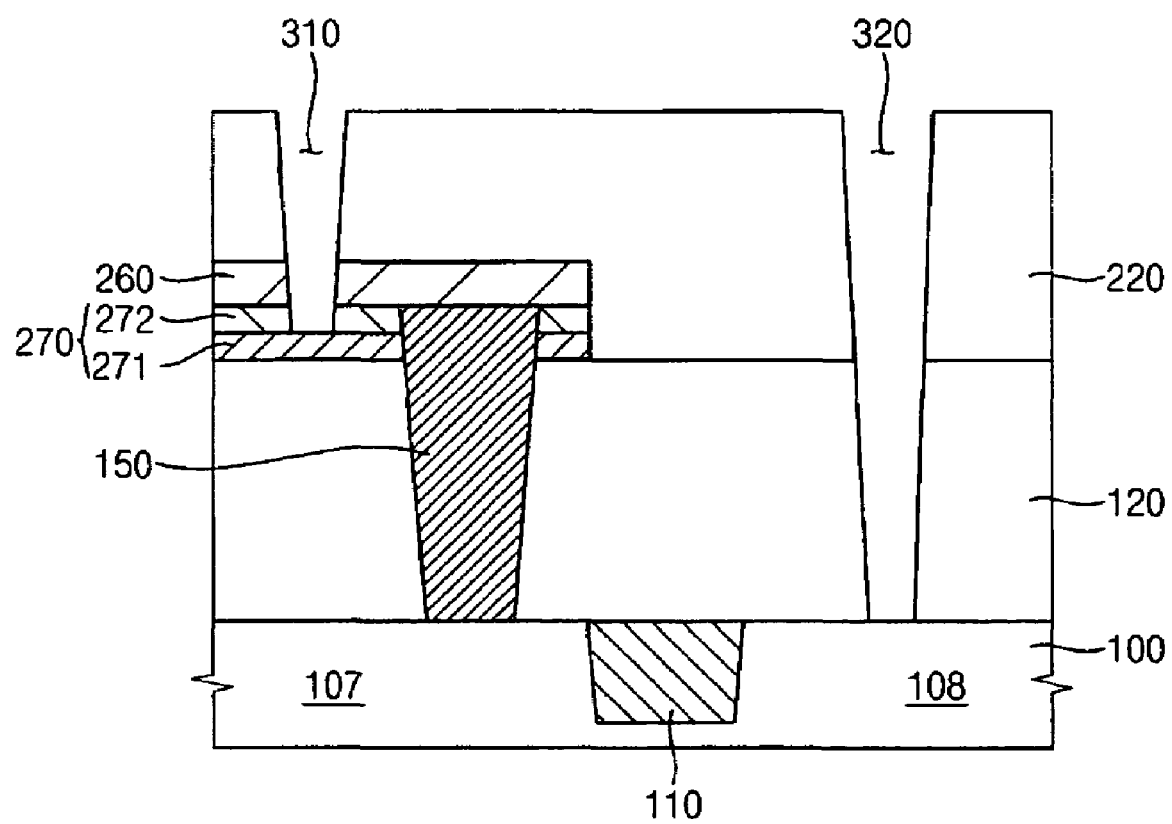
FIGS. 21 and 22 are cross-sectional views illustrating methods of manufacturing the exemplary channel structure shown in FIG. 20.
Figure 22:
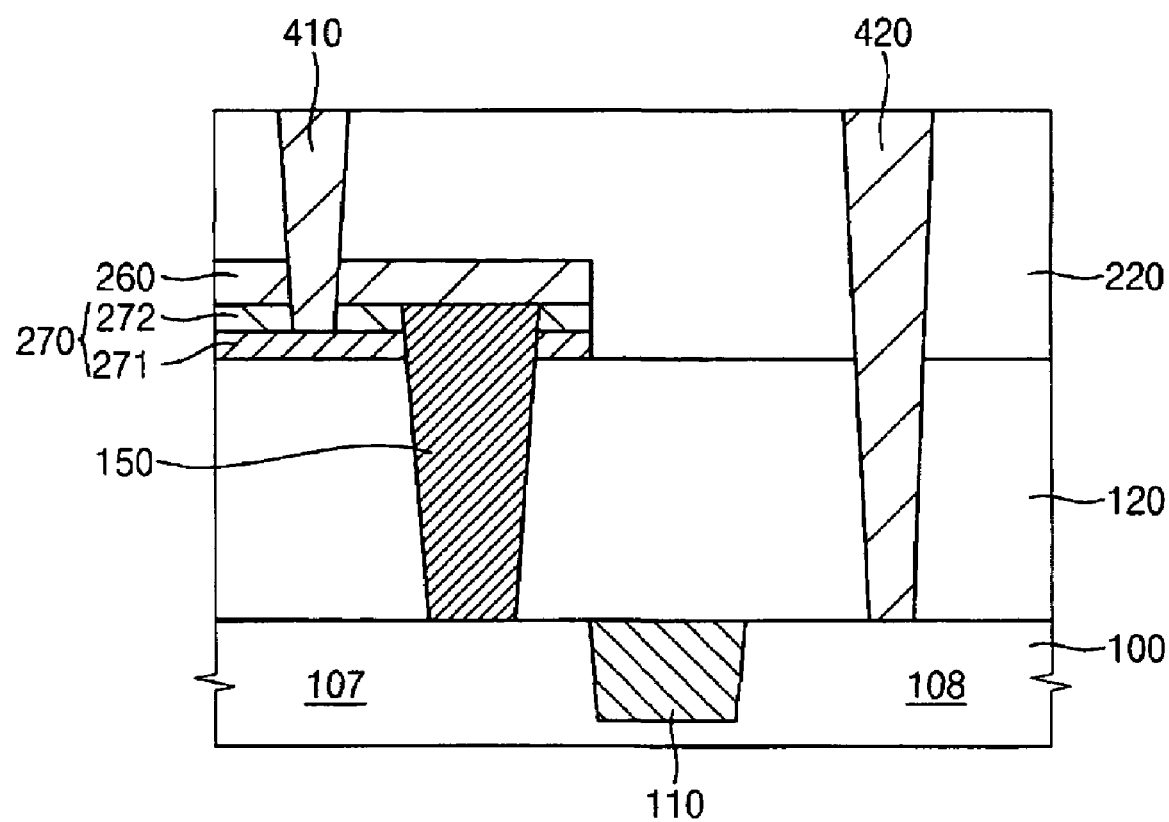

FIGS. 21 and 22 are cross-sectional views illustrating a method of manufacturing the exemplary channel structure 400 shown in FIG. 20.

The method of manufacturing channel structure 4000 is substantially similar to that already illustrated and described with reference to FIGS. 13 through 16 except for the formation of first and second contacts 410 and 420.

Referring to FIG. 21, a photolithography process is performed on first and second insulation layers, 120 and 220, to form first and second holes 310 and 320, respectively. Here, second hole 320 exposes second conductive region 108 of substrate 100. On the other hand, first hole 310 does not expose any portion of substrate 100 due to compound punch-through prevention film pattern 270 comprises first punch-through prevention film pattern 271 and a second punch-through prevention film pattern 272.

Referring to FIG. 21, first and second contacts, 410 and 420, are formed in first and second holes 310 and 320, respectively. First contact 410 makes electrical contact with channel film pattern 260, but not any portion of substrate 100. Second contact 420 makes electrical contact with second conductive region 108 of substrate 100.

Because compound punch-through prevention film pattern 270 is formed under channel film pattern 260, first contact 410 will not make improper contact with substrate 100 through first insulation layer 120, thereby preventing formation of a punch-through defect.

In any one of the preceding embodiments of the invention, a punch-through prevention film is formed under a channel film pattern. Thus, a subsequently formed contact making electrical contact with the channel film pattern will not make improper connection to a conductive region positioned below the punch-through prevention film pattern.

The foregoing embodiments are illustrative of the invention, but the invention is not limited to only the illustrated example. Those skilled in the art will readily appreciate that many modifications are possible in the embodiments without materially departing from the novel teachings and advantages of this invention. Accordingly, all such modifications are intended to be included within the scope of the invention as defined in the claims.

What is claimed is:

1. A method of manufacturing a semiconductor device, the method comprising:

forming a first insulation layer on a substrate, the substrate comprising a first conductive region;

forming a punch-through prevention film on the first insulation layer;

forming an opening through the first insulation layer and the punch-through prevention film to expose the first conductive region;

forming an epitaxial plug in the opening on the first conductive region;

forming a channel film on the punch-through prevention film and the epitaxial plug;

forming a punch-through prevention film pattern and the channel film pattern by patterning the punch-through prevention film and the channel film;

forming a second insulation layer on the first insulation layer to cover the punch-through prevention film pattern and the channel film pattern; and forming a first contact making electrical contact with the channel film pattern through the second insulation layer, the punch-through prevention film being not penetrated by the first contact.

2. The method of claim 1, wherein the punch-through prevention film is formed by depositing a material having an etch selectivity with respect to the first insulation layer.

3. The method of claim 1, wherein the punch-through prevention film has a single-filmed structure and is formed from silicon nitride.

4. The method of claim 1, wherein forming the punch-through prevention film comprises:

forming a first punch-through prevention film from silicon oxynitride on the first insulation layer; and forming a second punch-through prevention film from silicon nitride on the first punch-through prevention film.

5. The method of claim 1, wherein forming the channel film comprises:

forming an amorphous silicon layer on the punch-through prevention film and the epitaxial plug; and thermally treating the amorphous silicon layer to obtain the channel film.

6. The method of claim 1, wherein the substrate further comprises a second conductive region, and the method further comprises:

forming a second contact making electrical contact with the second conductive region through the first and second insulation layers, the second contact being formed simultaneously with the first contact.

* * * * *